United States Patent [19]

Maley et al.

[11] Patent Number: 4,829,198

[45] Date of Patent: May 9, 1989

[54] FAULT TOLERANT LOGICAL CIRCUITRY

[75] Inventors: Gerald A. Maley, Fishkill, N.Y.; Joseph M. Mosley, Boca Raton, Fla.; Stephen D. Weitzel, Poughkeepsie, N.Y.

[73] Assignee: International Business Machines Corporation, Armonk, N.Y.

[21] Appl. No.: 37,306

[22] Filed: Apr. 10, 1987

[51] Int. Cl.$^4$ .................. H03K 19/007; H03K 19/20; H01J 19/82; G06F 11/08

[52] U.S. Cl. ...................................... 307/441; 307/442; 307/455; 307/456; 307/457; 307/219; 371/36

[58] Field of Search .................. 371/36; 307/441, 442, 307/219, 455, 457, 456

[56] References Cited

U.S. PATENT DOCUMENTS

| | | | |
|---|---|---|---|
| 2,910,584 | 10/1959 | Steel | 307/441 |
| 3,016,517 | 1/1962 | Saltzberg | 307/441 |
| 3,134,032 | 5/1964 | Mann | 307/464 |
| 3,305,830 | 2/1967 | Constantine, Jr. | 371/36 |
| 3,451,042 | 6/1969 | Jensen | 340/310 A |
| 3,543,048 | 11/1970 | Klaschka | 307/441 |
| 3,900,741 | 8/1975 | Fletcher | 307/219 |
| 4,199,799 | 4/1980 | Ostenso | 307/219 |
| 4,215,340 | 5/1980 | Lejon | 340/507 |
| 4,276,643 | 6/1981 | Laprie | 371/8 |
| 4,521,700 | 6/1985 | Blumberg et al. | 307/456 |
| 4,709,166 | 11/1987 | Banker et al. | 307/219 |
| 4,719,629 | 1/1988 | Wang | 307/219 |
| 4,723,242 | 2/1988 | Larson et al. | 371/36 |

Primary Examiner—Stanley D. Miller
Assistant Examiner—Trong Quang Phan
Attorney, Agent, or Firm—Wesley DeBruin; Alexander Tognino

[57] ABSTRACT

A fault tolerant logic circuit capable of absorbing many D.C. and A.C. defects. The logic circuit employs a number of redundant logic gate circuits. The gate circuits are arranged in at least first and second interconnected signal paths. The logic gate circuits have two independent outputs. The two independent outputs are each connected to an input in a discrete one the first and second interconnected signal paths.

8 Claims, 8 Drawing Sheets

FAULT TOLERANT LOGICAL CIRCUITRY

CROSS REFERENCE TO RELATED APPLICATIONS

U.S. Pat. No. 4,719,629 entitled "Dual Fault-Masking Redundancy Logic Circuits" issued Jan. 12, 1988 by W. Y. Wang.

TECHNICAL FIELD

The invention relates to logic circuits. More particularly, the invention relates to a fault tolerant logic design which utilizes redundant circuitry and interwoven input and output circuit paths.

BACKGROUND OF THE INVENTION

As integrated circuits for logic become even larger and more complex, usually as a result of further miniaturization of individual elements, it has become increasingly difficult to produce perfectly operating logic circuits at an acceptable yield. As the dimensions for the electrical components on the integrated circuit chip have become ever smaller, the processing margins have decreased. At an earlier date, the margins were sufficiently large that an acceptable yield of perfect, or good chips was more readily obtained. In addition, noise margins have been correspondingly decreasing. As a result a logic chip may operate satisfactorily a majority of the time but occasionally a noise transient is randomly impressed upon one of the internal lines and an incorrect operation results.

As a result, increasing attention has been devoted to error correcting logic, both for the hard failures of the exceeded processing margins and for the soft failures of the transient noise failures.

Also a large fraction of the failures are associated, not only with the logic functions themselves, but also with the interconnections between separated active devices. Internal logic signals often need to be conveyed relatively long distances. If there are a large number of such internal logic signal interconnections, the designer attempts to make the interconnection pathways as dense as possible. That is, the interconnections, typically of metal, are made very narrow and closely spaced. There are several failure modes for these interconnections. An interconnection can become separated somewhere in the middle so that the input to the following logic stage sees an open circuit, that is a floating potential. Another failure mode is that two neighboring, or adjacent, interconnections are shorted together. In many types of logic, when two wires carrying different signals are shorted together, one logic level will dominate over the other. Thus, in this failure mode in which one wire carries a high logic signal and the other carries a low logic signal, a short will produce a predetermined logic signal, for instance a high logic signal in many important technologies. A third failure mode is where the metal interconnection shorts to a fixed potential, forcing a false logic signal on a signal wire.

BACKGROUND ART

There is a large number of redundant and fault tolerant circuits known to the art. It is to be appreciated with reference to the subject invention, that, the following art is not submitted to be the only prior art, the best prior art, or the most pertinent prior art.

U.S. Pat. No. 2,910,584 entitled "Voted-Output Flip-Flop Unit" granted Oct. 27, 1959 to F. G. Steele.

U.S. Pat. No. 3,016,517 entitled "Redundant Logic Circuitry" granted Jan. 9, 1962 to B. R. Saltzberg.

U.S. Pat. No. 3,134,032 entitled "Error Canceling Decision Circuit" granted May 19, 1964 to W. C. Mann.

U.S. Pat. No. 3,305,830 entitled "Error Correcting Redundant Logic Circuitry" granted Feb. 21, 1967 to G. Constantine, Jr.

U.S. Pat. No. 3,451,042 entitled "Redundant Signal Transmission System" granted June 17, 1969 to P. A. Jensen et al.

U.S. Pat. No. 3,543,048 entitled "Redundant Binary Logic Circuits" granted Nov. 24, 1970 to T. F. Klascka.

U.S. Pat. No. 3,900,741 entitled "Fault Tolerant Clock Apparatus Utilizing A Controlled Minority of Clock Elements" granted Aug. 19, 1975 to J. C. Fletcher et al.

U.S. Pat. No. 4,199,799 entitled "Supervisory Circuit For Redundant Channel Control Systems" granted Apr. 22, 1980 to A. L. Ostenso et al.

U.S. Pat. No. 4,215,340 entitled "Process for the Automatic Signalling of Faults of A Static Automatic Module For Realizing The Process" granted July 29, 1980 to J. Lejon.

U.S. Pat. No. 4,276,643 entitled "Method of and Means For Routing Binary Messages Through A Multinode Data-Transmission System" granted June 30, 1981 to J. Lapier et al.

There are a number of redundancy techniques known to the art. One example is the Klaschka patent (U.S. Pat. No. 3,543,048 Nov. 25, 1970). Klaschka employs a redundant signal path to provide defect rejecting circuitry. However Klaschka's circuitry and technique will not reject a number of defects which frequently occur. Specifically, the ability to reject (obviate) logic gate to logic gate signal line shorts, opens, or series resistance. These defects can not be rejected (obviated) using single output logic gates.

In contrast to the Klaschka patent the disclosed invention is able to reject (obviate) the above mentioned defects by providing a second independent output on the logic gate and interweaving the inputs/outputs. This second output provides the key to rejecting (obviating) the signal line defects which could otherwise incapacitate both the primary logic signal path and the redundant logic signal path. Since the second output is wired electrically independent of the first output, it can propagate the logic signal even though an anomaly rendered the primary logic signal path useless.

SUMMARY OF THE INVENTION

The primary object of the invention is to provide a fault tolerant logic circuit.

A further object of the invention is to provide a fault tolerant logic circuit which is capable of absorbing most D.C. and A.C. faults.

A still further object of the invention is to provide a fault tolerant logic circuit employing a plurality of primary logic gates and redundant logic gates and wherein the logic gates have two independent outputs interconnecting primary logic gates and redundant logic gates.

The invention may be summarized as a fault tolerant logic circuit capable of absorbing many D. C. and A. C. faults. The logic circuit employs a number of redundant logic gate circuits. The gate circuits are arranged in at least first and second interconnected signal paths. The logic gate circuits have two independent outputs. The two independent outputs are each connected to an input in a discrete one of the first and second interconnected signal paths.

The foregoing and other objects, features and advantages of the invention will be apparent from the following more particular description of preferred embodiments of the invention, as illustrated in the drawings.

DESCRIPTION OF THE PREFERRED EMBODIMENT

As presently practiced, most VLSI integrated circuit chip designs are intolerant of any defects. That is, any D.C. stuck fault or any A.C. defect, which cannot be detected until placed in a machine, renders the chip useless. These defects occur at the time of chip fabrication, and can surface during machine build and debug, or in a customer's office. Therefore any method of salvaging the chip is worthwhile.

There are many types of defects which cause a circuit to become inoperative. Some examples of these defects are circuit to circuit signal lines open circuit, signal lines shorted to positive or negative power supplies, a missing output circuit pull up or pull down resistor, or a single defective logic gate. Any one of these defects makes the chip useless. In the initial stages of a new product, the process yield often is very low. A small defect will eliminate a chip. However, if there were a way to salvage these chips the cost per unit would drop substantially.

Many of the defects described above occur at time of fabrication and can be tested and sorted. However, sometimes these defects can surface after the machine is installed in the customer's office. At each succeeding step in the build and delivery process, the cost of replacing a defective chip increases. Once in the customer's office, a chip failure is unacceptable.

Figure 1:
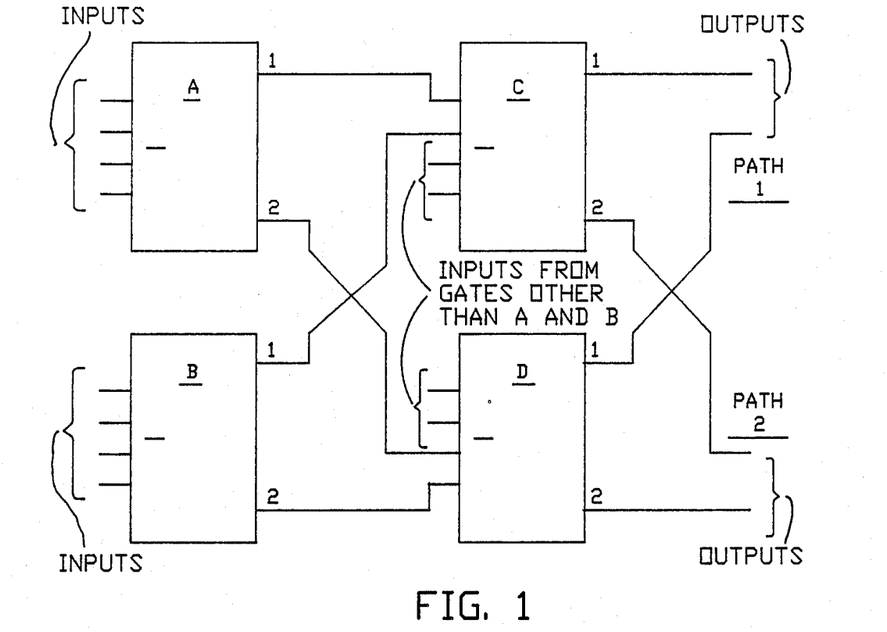
FIG. 1 discloses a block diagram of a fault tolerant logic circuit in accordance with the invention.

FIG. 1 shows a redundancy technique which rejects defective circuits and open or shorted signal lines. In the figure there are four logic circuits (at this point it is not important whether the circuits are NAND or NOR logic circuits) which create two interconnected logic paths (PATH 1 and PATH 2). Each logic path is capable of continuing the logic signal should a defect occur in the other path. By wiring the second output signal to the opposite parallel path, the signal can be regenerated in that path should a defect occur. This permits the defects to occur in either signal path and also provide additional protection further in the logic path to reject other possible defects. This duplication of signal lines results in two inputs to the logic gate per signal line.

Each circuit in the logic path has two independent outputs. For circuit A, the outputs are "1" and "2". Each output is wired to the next logic circuit in the logic chain, but in different logic paths. Output "1" is an input to circuit C (path 1) and output "2" is an input to circuit D (path 2). The electrically independent logic outputs provide isolation between the two signal lines. Should one signal wire be unable to continue the signal, the other redundant wire will continue the signal through the unaffected path and permit the logic signal to continue in the logic chain. In the Klaschka patent, should a defect occur on the signal line, such as a short circuit to a power supply bus, both logic paths would be affected. Under certain circumstances in the Klaschka circuit, the logic signal would not propagate through either redundant logic path. The second electrically independent output, in accordance with the invention, eliminates this short coming, by isolating the malfunction to only one logic path.

Figure 2:
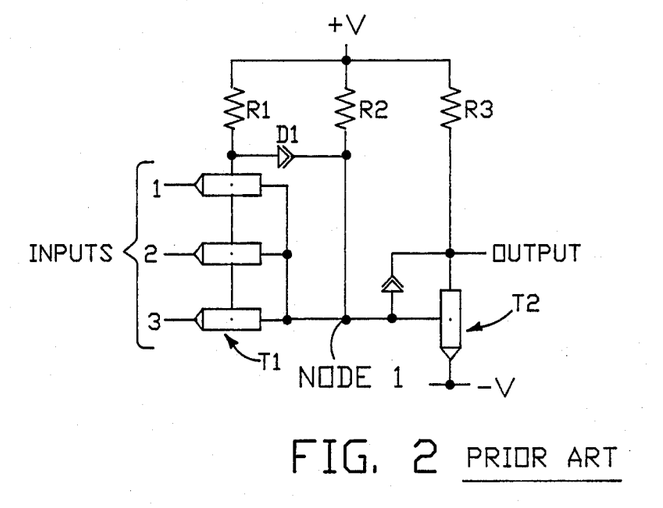
FIG. 2 discloses a known TTL logic circuit.
Figures 3, 4:
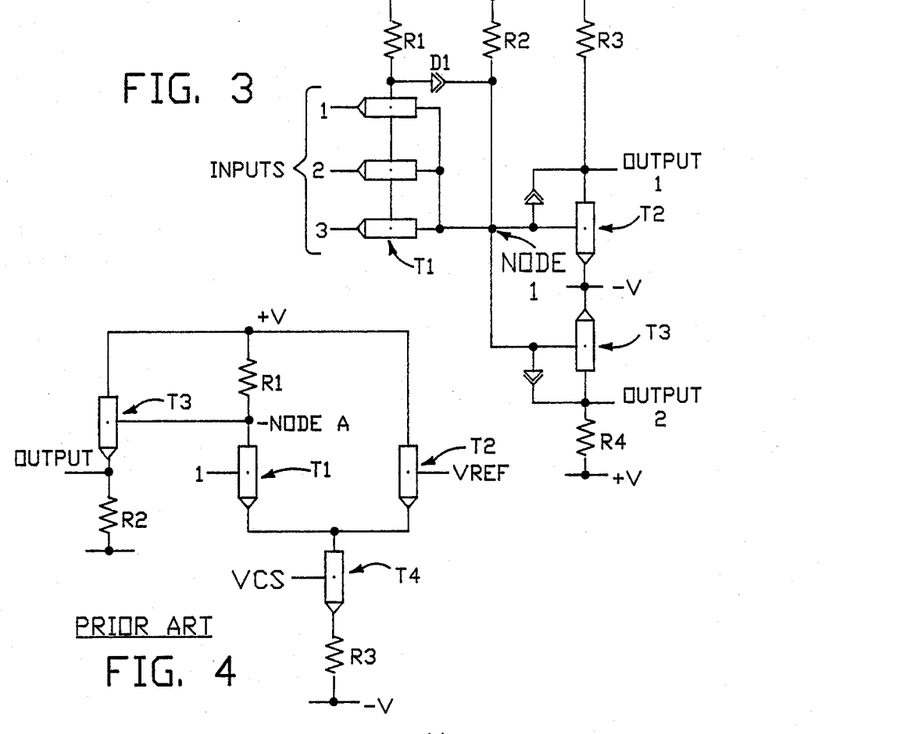
FIG. 3 discloses a TTL logic circuit modified in accordance with the invention.
FIG. 4 discloses a known (ECL) current switch logic circuit.

The new logic circuit with multiple isolated outputs can be created from logic families available today. FIG. 2 shows a TTL logic gate which can be modified to add a second isolated output as shown in FIG. 3. Resistor R4 and transistor T3 create the second isolated output for the TTL logic gate. The only additional modification to the standard TTL logic gate is adjusting the resistance of resistor R2 in FIG. 4 to provide additional current for transistor T3. The circuit operation of the standard and double output TTL logic gates are the same. In FIG. 2, a logic high level at all of the inputs of the circuit, inputs 1, 2, and 3, turns off transistor T1. Current flowing through resistor R2 causes transistor T2 to conduct. The resistor -diode combination of R1 and D1 also provides a small amount of current to node 1. When transistor T2 conducts, it causes the output to go to a logic low level. Transistor T2 conducts the current from both resistor R3 and the input current from the next logic gate in the logic path. When either input 1, 2, or 3 are at a logic low level, transistor T1 conducts the current from node 1, causing the voltage at node 1 to decrease. This turns off transistor T2 and permits resistor R3 to pull the output to a logic high level. The Schottky Barrier Diode connected to the base-collector junction of transistor T1 inhibits saturation in transistor T1.

The operation of the double output TTL logic gate, as shown in FIG. 3, has the same features as the single output logic gate but with a second output. A logic high level at the input of the circuit, inputs 1, 2, and 3, turns off transistor T1. Current flowing through resistor R2 causes transistors T2 and T3 to conduct. The resistor-diode combination of R1 and D1 also provides a small amount of current to node 1. When transistors T2 and T3 conduct, they cause each of their respective outputs to go to a logic low level. Transistor T2 conducts the current from both resistor R3 and the input current from the next logic gate it is connected to, while transistor T3 conducts the current from both resistor R4 and the input current from the next logic gate in the logic path. When at least one input 1, 2, or 3 is at a logic low level, transistor T1 conducts the current from node 1, causing the voltage at node 1 to decrease. This turns off transistors T2 and T3 and permits resistors R3 and R4 to independently pull each output to a logic high level. The Schottky Barrier Diode connected to the base-collector junction of transistor T1 inhibits saturation in transistor T1. The double output TTL logic circuit operates very similar to the standard TTL logic circuit, but has two electrically isolated outputs.

TTL and ECL circuits are well known in the art. For example, a detailed description and analysis of TTL and ECL circuits may be found in the text "Electronic Circuits, Digital and Analog" by Charles A. Holt, John Wiley and Sons Inc., copyright 1978.

This same technique can be applied to a current switch NOR logic circuit. FIG. 4 shows a single input current switch logic circuit which can be modified to a dual isolated output current switch circuit, shown in FIG. 5. The standard logic circuit includes transistors T1, T2, and T3, and T4 and resistors R1, R2, and R3. The standard current switch circuit operates as follows. When input 1 is at a logic low level, transistor T1 is non-conducting allowing resistor R1 to force the voltage at node "A" to become almost the same voltage as the positive power supply. Transistor T4 and resistor R3 form a current source. Since transistor T1 is not conducting, the current is conducted by transistor T2 to the positive supply. The output voltage at the emitter of transistor T3 is a Vbe below the positive power supply. R2 is the output pull down resistor which provides the discharge path for the negative going output transition. When input signal 1 is at a logic high level, transistor T1 conducts the current while transistor T2 is turned off. The current through T1 causes a voltage drop across resistor R1 equivalent to the product of the current source times the resistor R1. This produces a logic low level at transistor T3's emitter.

Figure 5:
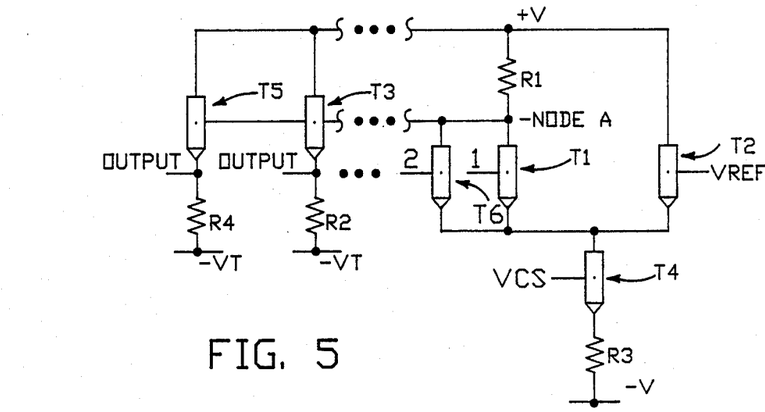
FIG. 5 discloses a current switch logic circuit modified in accordance with the invention.

The operation of the double output NOR logic gate, shown in FIG. 5, has the same features as the single output logic gate but with a second output. The double output logic circuit includes transistors T1, T2, T3, T4, T5 and T6 and resistors R1, R2, R3 and R4. The double output current switch circuit operates as follows. When inputs 1 and 2 are at a logic low level, transistors T1 and T6 are non-conducting allowing resistor R1 to force the voltage at node "A" to become almost the same voltage as the positive power supply. Transistor T4 and resistor R3 form a current source. Since transistors T1 and T6 are not conducting, the current is conducted by transistor T2 to the positive supply. The output voltages at the emitters of transistors T3 and T5 are a Vbe below the positive power supply. R2 and R4 are the output pull down resistors which provide the discharge path for the negative going output transitions. When the input signals 1 and/or 2 are at a logic high level, transistors T1 and/or T6 conduct the current while transistor T2 is turned off. The current through T1 and/or T6 causes a voltage drop across resistor R1 equivalent to the product of the current source times the resistor R1. This produces a logic low level at transistor T3's and T5's emitter. (It is to be appreciated that as shown in FIG. 5, the practice of applicants' invention requires ECL circuits having first and second independent outputs and at least first and second inputs)

Figure 6:
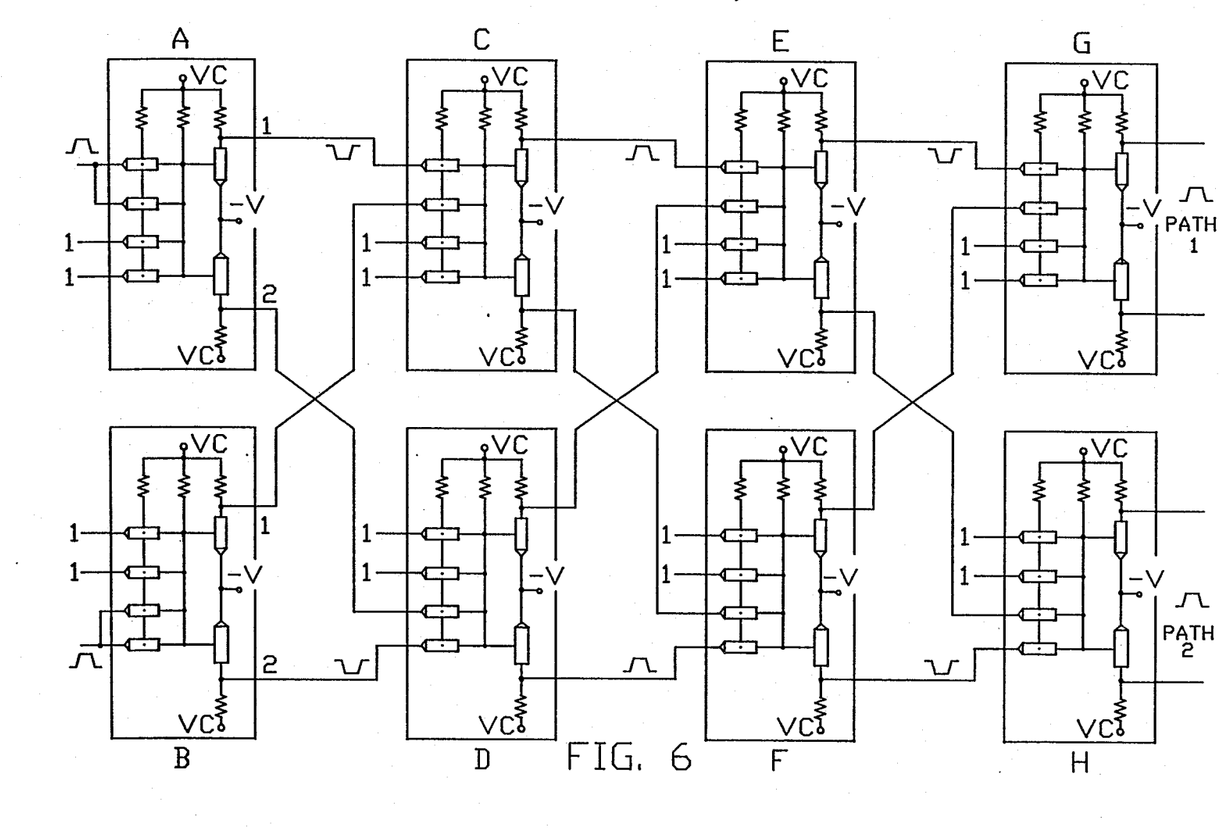
FIG. 6 discloses a (TTL) fault-tolerant logic circuit in accordance with the invention.

The double output TTL logic gate implementation is shown in FIG. 6. The logic signal path includes PATH 1 and PATH 2. Each path includes double output TTL logic gate with multiple inputs to show the technique is extendable to more than the simple single signal line shown in FIG. 1. For clarity of the diagram, the logic gates creating logic 1 levels are not shown, but are generally of the same type as shown in the diagram. PATH 1 includes logic gates A, C, E, and G. PATH 2 includes logic gates B, D, F, and H. Each of the logic gates A, B, C, D, E, F, G, and H are composed of double output TTL logic gates with four input lines. Operation of these logic gates was described above. Logic gate A output 1 is connected to logic gate C input and logic gate A output 2 is connected to logic gate D input. Logic gate B output 1 is connected to logic gate C input and logic gate B output 2 is connected to logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 6, the circuit operates as follows. A logic 1 level at the inputs of logic gate A produces a logic 0 level at both outputs. One of the logic 0 levels goes to logic gate C, while the second logic 0 level goes to logic gate D. Since both PATH 1 and PATH 2 are propagating the same signal, the inputs to logic gate B are also logic 1 levels. The outputs of logic gate B are also at a logic 0 level. One of the logic 0 levels goes to logic gate C, while the second logic 0 level goes to logic gate D. Logic gate C now has two logic 0 levels and two logic 1 levels which produces a logic 1 level at both outputs. One of the logic 1 levels goes to logic gate E, while the second logic 1 level goes to logic gate F. Logic gate D also has two logic 0 levels and two logic 1 levels which produces a logic 1 level at both outputs. One of the logic 1 levels goes to logic gate E, while the second logic 1 level goes to logic gate F. This logic signal will continue in both PATH 1 and PATH 2, alternating between logic level 1 and 0 at the outputs of the logic gates.

Similarly, a logic 0 level at two inputs and a logic 1 level at two inputs of logic gate A produces a logic 1 level at both outputs. One of the logic 1 levels goes to logic gate C, while the second logic 1 level goes to logic gate D. Since both PATH 1 and PATH 2 are propagating the same signal, the inputs to logic gate B are also two logic 0 levels and two logic 1 levels. The outputs of logic gate B are also at a logic 1 level. One of the logic 1 levels goes to logic gate C, while the second logic 1 level goes to logic gate D. Logic gate C inputs now have logic 1 levels which produce a logic 0 level at both outputs. One of the logic 0 levels goes to logic gate E, while the second logic 0 level goes to logic gate F. Logic gate D inputs also have logic 1 levels which produce a logic 0 level at both outputs. One of the logic 0 levels goes to logic gate E, while the second logic 0 level goes to logic gate F. It can be seen that this logic signal will continue in both PATH 1 ad PATH 2, alternating between logic level 1 and 0 at the outputs of alternating logic gates in the path.

Figure 7:
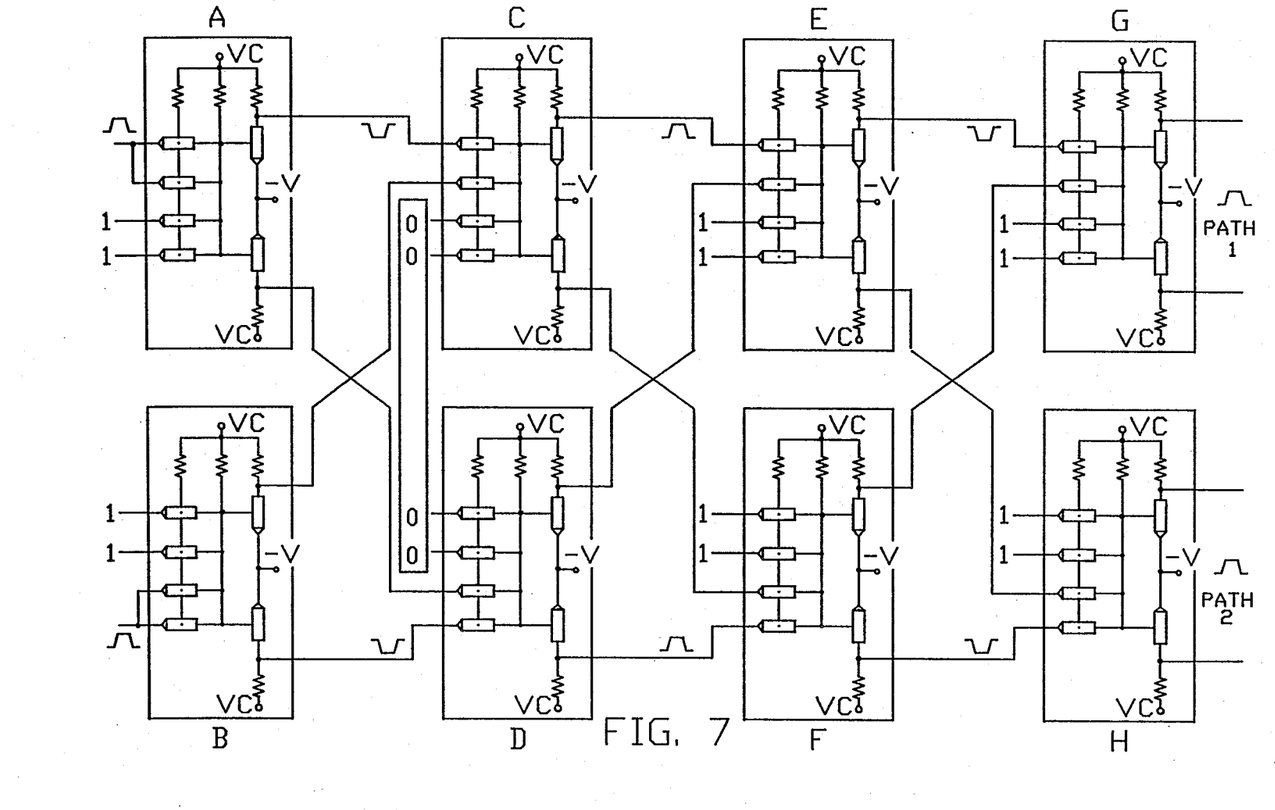
FIG. 7 discloses a (TTL) fault-tolerant logic circuit in accordance with the invention.

In the above explanation, additional unshown logic gates provided logic level 1 inputs to PATH 1 and PATH 2. In any application a logic path can expect these additional inputs to provide logic level 0 inputs. FIG. 7 shows an example of logic level 0 inputs from the unshown logic gates. This example is intended to demonstrate the technique does function as a complete logic circuit in all aspects.

The TTL logic gate implementation, demonstrating logic level 0 inputs from other logic gates, is shown in FIG. 7. The logic signal path includes PATH 1 and PATH 2. Each path includes the double output TTL logic gates with multiple inputs. For clarity of the diagram, logic gates creating logic 1 and 0 levels are not shown, but are of the same type as shown in the diagram. PATH 1 consists of logic gates A, C, E, and G. PATH 2 consists of logic gates B, D, F, and H. Each of the logic gates A, B, C, D, E, F, G, and H are composed of double output TTL logic gates with four input lines. Operation of these logic gates was described above. Logic gate A output 1 is connected to logic gate C input and logic gate A output 2 is connected to logic gate D input. Logic gate B output 1 is connected to logic gate C input and logic gate B output 2 is connected to logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 7, the circuit operates as follows. A logic 1 level at the inputs of logic gate A produces a logic 0 level at both outputs. One of the logic 0 levels goes to logic gate C, while the second logic 0 level goes to logic gate D. Since both PATH 1 and PATH 2 are propagating the same signal, the inputs to logic gate B are also logic 1 levels. The outputs of logic gate B are also at a logic 0 level. One of the logic 0 levels goes to logic gate C, while the second logic 0 level goes to logic gate D. Logic gate C now has four logic 0 levels which produces a logic 1 level at both outputs. Two logic 0 levels are from logic gates A and B, and two logic 0 levels are from unshown logic gates. One of the logic 1 levels from gate C goes to logic gate E, while the second logic 1 level goes to logic gate F. Logic gate D also has four logic 0 levels which produce a logic 1 level at both outputs. Two logic 0 levels are from logic gates A and B, and two logic 0 levels are from unshown logic gates. One of the logic 1 levels from gate D goes to logic gate E, while the second logic 1 level goes to logic gate F. It is apparent that this logic signal will continue in both PATH 1 and PATH 2, alternating between logic level 1 and 0 at the outputs of the logic gates.

Similarly, a logic 0 level at two inputs and a logic 1 level at two inputs of logic gate A produces a logic 1 level at both outputs. One of the logic 1 levels goes to logic gate C, while the second logic 1 level goes to logic gate D. Since both PATH 1 and PATH 2 are propagating the same signal, the inputs to logic gate B are also two logic 0 levels and two logic 1 levels. The outputs of logic gate B are also at a logic 1 level. One of the logic 1 levels goes to logic gate C, while the second logic 1 level goes to logic gate D. Logic gate C inputs now have two logic 1 levels from gates A and B and two logic 0 levels from unshown logic gates which produce a logic 1 level at both outputs. One of the logic 1levels goes to logic gate E, while the second logic 1 level goes to logic gate F. Logic gate D inputs also have two logic 1 levels from gates A and B and two logic 0 levels from unshown logic gates which produce a logic 1 level at both outputs. One of the logic 1 levels goes to logic gate E, while the second logic 1 level goes to logic gate F. Those skilled in the art can see this logic signal will continue in both PATH 1 and PATH 2, alternating between logic level 1 and 0 at the outputs of alternating logic gates in the path. The unshown logic gate inputs to gates C and D modify the propagation of a signal in PATH 1 and 2 just as it would in any non-redundant logic circuit.

There are several defects which can interrupt the signal propagation in a logic path: signal line opens and signal line shorts to positive and negative power supply buses. The fault-tolerant technique in accordance with the invention will address each defect independently and demonstrate how the circuitry is immune to the defect.

The first defect to be discussed is the open circuit signal line. This can be caused by defect in the metal conducting pattern providing a discontinuous electrical path. Another possible reason for an open circuit is a missing interlevel electrical connection path due to missing pattern. The result of an open circuit is a non-functioning logic path. This invention rejects the open circuit and provides a continuity in the logic path.

Figure 8:
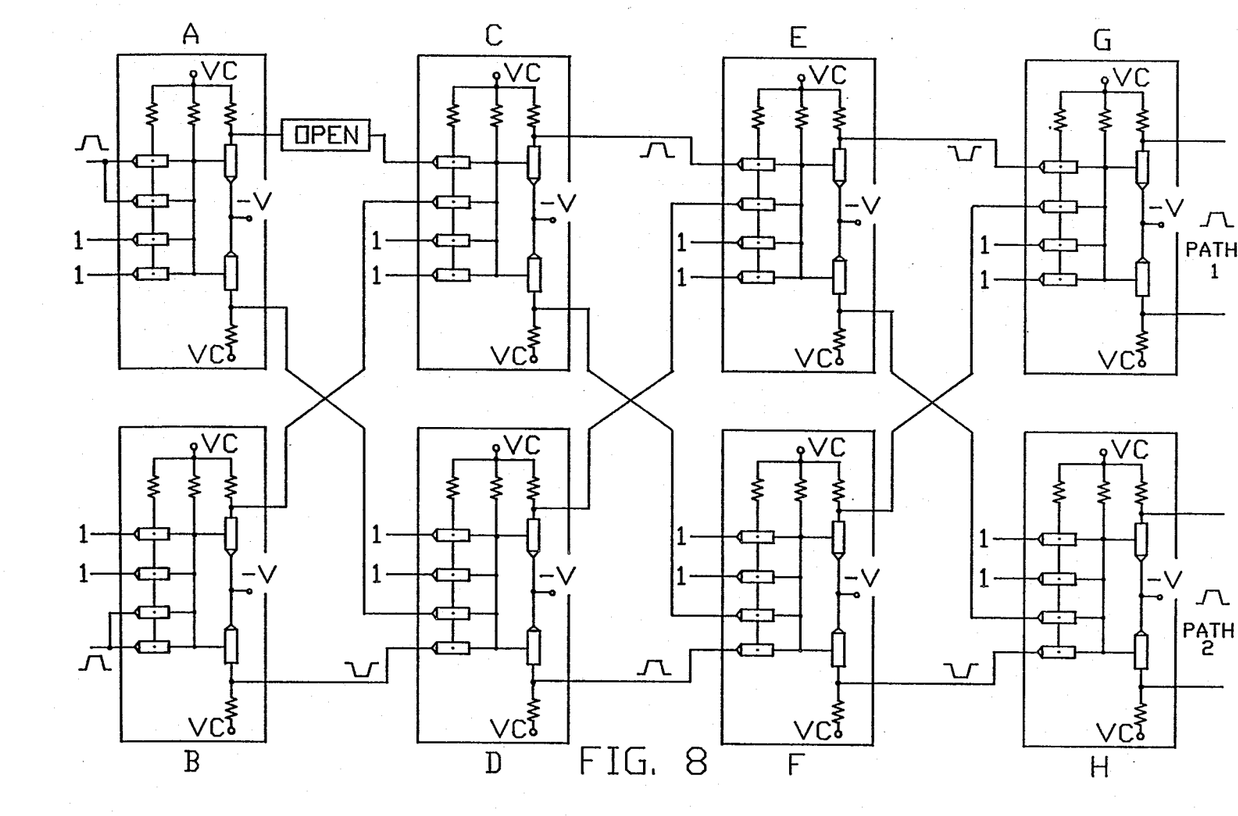
FIG. 8 discloses a (TTL) fault-tolerant logic circuit in accordance with the invention.

The TTL logic gate implementation for rejecting open circuits is shown in FIG. 8. The logic signal path includes PATH 1 and PATH 2. Each path includes the double output TTL logic gate with multiple inputs to show the technique is extendable to more than the simple single signal line of the prior art. For clarity of the diagram, the logic gates creating logic 1 levels are not shown but are of the same type as shown in the diagram. PATH 1 consists of logic gates A, C, E, and G. PATH 2 consists of logic gates B, D, F, and H. Each of the logic gates A, B, C, D, E, F, G, and H are composed of double output TTL logic gates with four input lines. Operation of these logic gates was described above. Logic gate A output 1 is connected to a logic gate C input and logic gate A output 2 is connected to a logic gate D input. However, in this example logic gate A output 1 is open circuited to demonstrate the ability to reject open circuits. Logic gate B output 1 is connected to a logic gate C input and logic gate B output 2 is connected to a logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 8, the circuit operates as follows. A logic 1 level at the inputs of logic gate A produces a logic 0 level at both outputs. One of the logic 0 levels intended for logic gate C is open circuited, while the second logic 0 level goes to logic gate D. Since both PATH 1 and PATH 2 are propagating the same signal, the inputs to logic gate B are also logic 1 levels. The outputs of logic gate B are also at a logic 0 level. One of the logic 0 levels goes to logic gate C, while the second logic 0 level goes to logic gate D. Logic gate C now has one logic 0 level and two logic 1 levels and one open circuit input. For TTL, an open circuit input can be treated as a logic 1 level. Logic gate C produces a logic 1 level at both outputs due to the logic 0 level from logic B gate. One of the logic 1 from logic gate C goes to logic gate E, while the second logic 1 level goes to logic gate F. Logic gate D has two logic 0 levels and two logic 1 levels which produce a logic 1 level at both outputs. One of the logic 1 levels goes to logic gate E, while the second logic 1 level goes to logic gate F. It can be seen that the logic signal will continue in both PATH 1 and PATH 2, alternating between logic level 1 and 0 at the outputs of the logic gates.

Similarly, a logic 0 level at two inputs and a logic 1 level at two inputs of logic gate A produces a logic 1 level at both outputs. One of the logic 1 levels intended for logic gate C is open circuited, while the second logic level goes to logic gate D. Since both PATH 1 and PATH 2 are propagating the same signal, the inputs to logic gate B are also two logic 0 levels and two logic 1 levels. The outputs of logic gate B are also at a logic 1 level. One of the logic 1 levels goes to logic gate C, while the second logic 1 level goes to logic gate D. Logic gate C inputs now have three logic 1 levels and an open circuit, which can be treated as a logic 1 level as described above, which produce a logic 0 level at both outputs. One of the logic 0 levels goes to logic gate E, while the second logic 0 level goes to logic gate F. Logic gate D inputs also have logic 1 levels which produce a logic 0 level at both outputs. One of the logic 0 levels goes to logic gate E, while the second logic 0 level goes to logic gate F. It is apparent that this logic signal will continue in both PATH 1 and PATH 2, alternating between logic level 1 and 0 at the outputs of alternating logic gates in the path.

The second defect to be described is the signal line shorted to a positive power supply bus. This defect may be caused by a breakdown of the insulation between the conducting layers resulting in a short circuit between the two conducting patterns. The short circuit between positive power supply and signal lines can also be caused by two metal patterns on the same layer which are adjacent to each other and at minimal separation as provided by the fabrication process. Occasionally, an imperfection in the photoresist creating these two patterns allows the two isolated structures to become connected by a very small piece of conductive material. This forms a short circuit between the two metal wires. In either case the result is a signal line with a positive power supply voltage on it. Electrically, the positive voltage will appear to the logic gates as a logic level high signal. The logic gate receiving this signal will interpret the signal as a logic level high and will react to the signal accordingly. In the case of the TTL logic gate, the logic level high signal permits the receiving logic gate to operate as if that input were not present. The following example will demonstrate this concept.

Figure 9:
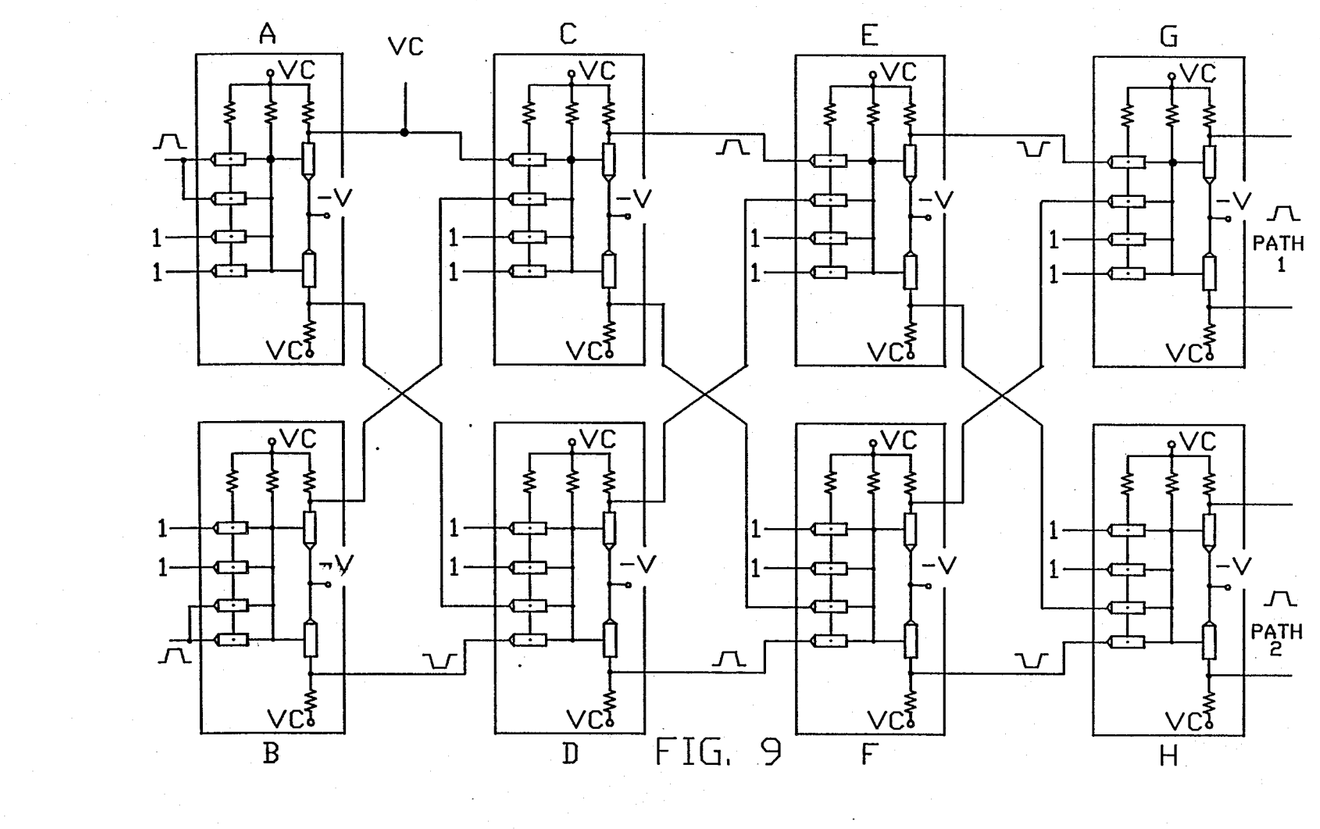
FIG. 9 discloses an (TTL) fault-tolerant logic circuit in accordance with the invention.

The TTL logic gate implementation for rejecting signal line shorts to the positive power supply is shown in FIG. 9. The logic signal path includes PATH 1 and PATH 2. Each path includes the double output TTL logic gate with multiple inputs. For clarity of the diagram, the logic gates creating logic 1 levels are not shown, but are of the same type as shown in the diagram. PATH 1 consists of logic gates A, C, E, and G. PATH 2 consists of logic gates B, D, F, and H. Each of the logic gates A, B, C, D, E, F, G, and H are composed of double output TTL logic gates with four input lines. Operation of these logic gates was described above. Logic gate A output 1 is connected to logic gate C input and logic gate A output 2 is connected to logic gate D input. However, in this example logic gate A output 1 is short circuited to the positive power supply to demonstrate the ability to reject short circuits to the positive power supply. Logic gate B output 1 is connected to logic gate C input and logic gate B output 2 is connected to logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 9, the circuit operates as follows. A logic 1 level at the inputs of logic gate A produces a logic 0 level at both outputs. One of the logic 0 levels intended for logic gate C is short circuited to the positive power supply, while the second logic 0 level goes to logic gate D. Since both PATH 1 and PATH 2 are propagating the same signal, the inputs to logic gate B are also at a logic 1 levels. The outputs of logic gate B are also at a logic 0 level. One of the logic 0 levels goes to logic gate C, while the second logic 0 level goes to logic gate D. Logic gate C now has one logic 0 level and two logic 1 levels and one input short circuited to the positive power supply. As described above, for TTL, the short circuit to a positive power supply can be treated as a logic 1 level. Logic gate C produces a logic 1 level at both outputs due to the logic 0 level from logic gate B. One of the logic 1 levels from logic gate C goes to logic gate E, while the second logic 1 level goes to logic gate F. Logic gate D has two logic 0 levels and two logic 1 levels which produce a logic 1 level at both outputs. One of the logic 1 levels goes to logic gate E, while the second logic 1 level goes to logic gate F. It can be seen that this logic signal will continue in both PATH 1 and PATH 2, alternating between logic level 1 and 0 at the outputs of the logic gates.

Similarly, a logic 0 level at two inputs and a logic 1 level at two inputs of logic gate A produces a logic 1 level at both outputs. One of the logic 1 levels intended for logic gate C is short circuited to the positive power supply buss and can be treated as a logic 1 level, while the second logic 1 level goes to logic gate D. Since both PATH 1 and PATH 2 are propagating the same signal, the inputs to logic gate B are also two logic 0 levels and two logic 1 levels. The outputs of logic gate B are also at a logic 1 level. One of the logic 1 levels goes to logic gate C, while the second logic 1 level goes to logic gate D. Logic gate C inputs now have three logic 1 levels and a logic level 1 from the signal line to positive power supply bus short circuit, which produce a logic 0 level at both outputs. One of the logic 0 levels goes to logic gate E, while the second logic 0 level goes to logic gate F. Logic gate D inputs also have logic 1 levels which produce a logic 0 level at both outputs. One of the logic 0 levels goes to logic gate E, while the second logic level goes to logic gate F. Those skilled in the art can see this logic signal will continue in both PATH 1 and PATH 2, alternating between logic level 1 and 0 at the outputs of alternating logic gates in the path.

As shown in the preceding example, the short circuit between the signal line and the positive power supply bus was treated as if the input signal were not present. The result is the signals traveled through both PATH 1 and 2 as if the defect never occurred. The defect was rejected within one logic gate, permitting the next logic gate to operate as it normally would and having the ability to reject any of the defects described.

The signal line could also short circuit to a negative power supply bus in the same manner as the positive power supply bus shorted to the signal line. The result of the short circuit is a signal line with a negative power supply voltage on it. Electrically, the negative voltage will appear to the logic gates as a logic 0 level signal. The logic gate receiving this signal will interpret the signal as a logic 0 level and will react to the signal accordingly. In the case of the TTL logic gate, the logic 0 level signal causes the receiving logic gate to reject the signals on the other inputs. The outputs will be at a logic 1 level regardless of the other input logic signals. The following example will demonstrate this concept.

Figure 10:
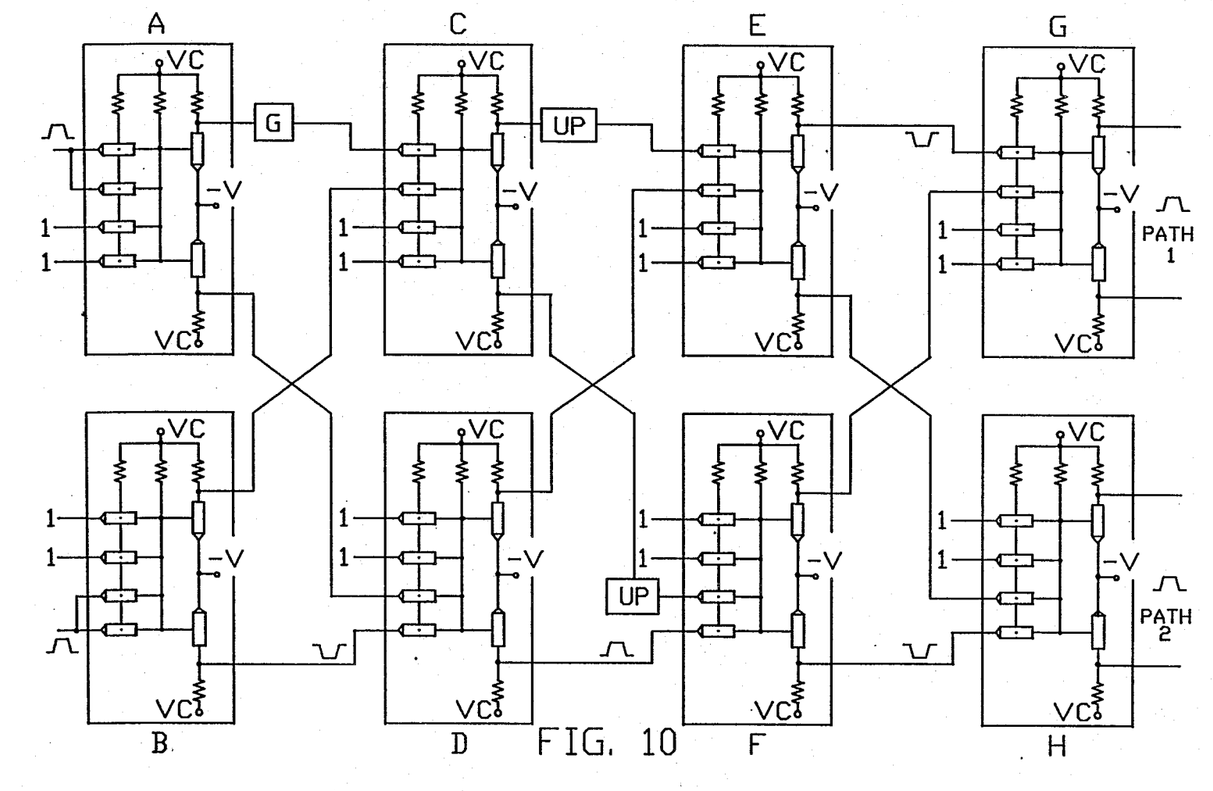
FIG. 10 discloses an (TTL) fault-tolerant logic circuit in accordance with the invention.

The TTL logic gate implementation for rejecting signal line shorts to the negative power supply is shown in FIG. 10. The logic signal path consists of PATH 1 and PATH 2. Each path includes the double output TTL logic gate with multiple inputs. For clarity of the diagram, the logic gates creating logic 1 levels are not shown, but are of the same type as shown in the diagram. PATH 1 consists of logic gates A, C, E, and G. PATH 2 consists of logic gates B, D, F, and H. Each of the logic gates A, B, C, D, E, F, G, and H are composed of double output TTL logic gates with four input lines. Operation of these logic gates was described above. Logic gate A output 1 is connected to logic gate C input and logic gate A output 2 is connected to logic gate D input. However, in this example logic gate A output 1 is short circuited to the negative power supply to demonstrate the ability to reject short circuits to the negative power supply. Logic gate B output 1 is connected to logic gate C input and logic gate B output 2 is connected to logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 10, the circuit operates as follows. A logic 1 level at the inputs of logic gate A produces a logic 0 level at both outputs. One of the logic 0 levels intended for logic gate C is short circuited to the negative power supply, while the second logic 0 level goes to logic gate D. Since both PATH 1 and PATH 2 are propagating the same signal, the inputs to logic gate B are also logic 1 levels. The outputs of logic gate B are also at a logic 0 level. One of the logic 0 levels goes to logic gate C, while the second logic 0 level goes to logic gate D. Logic gate C now has one logic 0 level and two logic 1 levels and one input short circuited to the negative power supply. As described above, for TTL, the short circuit to a negative power supply can be treated as a logic 0 level. Logic gate C produces a logic 1 level at both outputs due to the logic 0 level at its inputs. One of the logic 1 levels from logic gate C goes to logic gate E, while the second logic 1 level goes to logic gate F. Logic gate D has two logic 0 levels and two logic 1 levels which produce a logic 1 level at both outputs. One of the logic 1 levels goes to logic gate E, while the second logic 1 level goes to logic gate F. It can be seen that this logic signal will continue in both PATH 1 and PATH 2, alternating between logic level 1 and logic level 0 at the outputs of the logic gates.

Similarly, a logic 0 level at two inputs and a logic 1 level at two inputs of logic gate A produces a logic 1 level at both outputs. One of the logic 1 levels intended for logic gate C is short circuited to the negative power supply bus and can be treated as a logic 0 level, while the second logic 1 level goes to logic gate D. Since both PATH 1 and PATH 2 are propagating the same signal, the inputs to logic gate B are also two logic 0 levels and two logic 1 levels. The outputs of logic gate B are also at a logic 1 level. One of the logic 1 levels goes to logic gate C, while the second logic 1 level goes to logic gate D. Logic gate C inputs now have three logic 1 levels and a logic 0 level from the signal line to negative power supply bus short circuit, which produce a logic 1 level at both outputs. One of the logic 1 levels goes to logic gate E, while the second logic 1 level goes to logic gate F. Logic gate D inputs also have logic 1 levels which produce a logic 0 level at both outputs. One of the logic 0 levels goes to logic gate E, while the second logic 0 level goes to logic gate F. Logic gate E inputs have a logic 1 level from gate C, a logic 0 level from gate D, and two other logic 1 levels. The logic 1 level from gate C is the false signal created by the short circuit to the negative power supply at the input of logic gate C. The output of logic gate E is a logic 1 level due to the true logic signal from logic gate D. The signal from logic gate C will always be stuck at logic 1 level, and thus never continue to propagate the remainder of the logic path. Logic gate F inputs have a logic 1 level from gate C, a logic 0 level from gate D, and two other logic 1 levels. The logic 1 level from gate C is the false signal created by the short to the negative power supply at the input of logic gate C. The output of logic gate F is a logic 1 level due to the true logic signal from logic gate D. The false signal from logic gate C is also stopped at logic gate F as it was stopped at logic gate E. It can be seen that this true logic signal will continue in both PATH 1 and PATH 2, alternating between logic level 1 and 0 at the outputs of alternating logic gates in the path.

As shown in this example, the defect caused logic gate C to have an erroneous output. However, due to the redundant logic path, logic gates E and F are able to provide correct logic signals to the logic paths. The correct signal is able to propagate through the logic path and provide a useable function regardless of a normally incapacitating defect.

The discussion thus far has centered on DC defects. That is, the defects have forced the signal lines to a specific logic level, whether it be a logic 1 or 0 level. There is another group of defects which affect system performance, which are called AC defects. These defects change the signal logic gate delay by altering the rate of voltage change from one logic level to another logic level. One defect which would change the signal delay (referring to FIG. 2) is resistor R3 becoming two or three times larger than the design value. This increases the amount of time required for a logic 0 level to change to a logic 1 level. Another AC defect is a high resistance in the signal line between logic gates A and C (FIG. 1). At the input of logic gate C, the logic 1 level to logic 0 level transition time increases due to the increased resistance. The discussion below will demonstrate the technique of rejecting AC defects.

Figure 11:
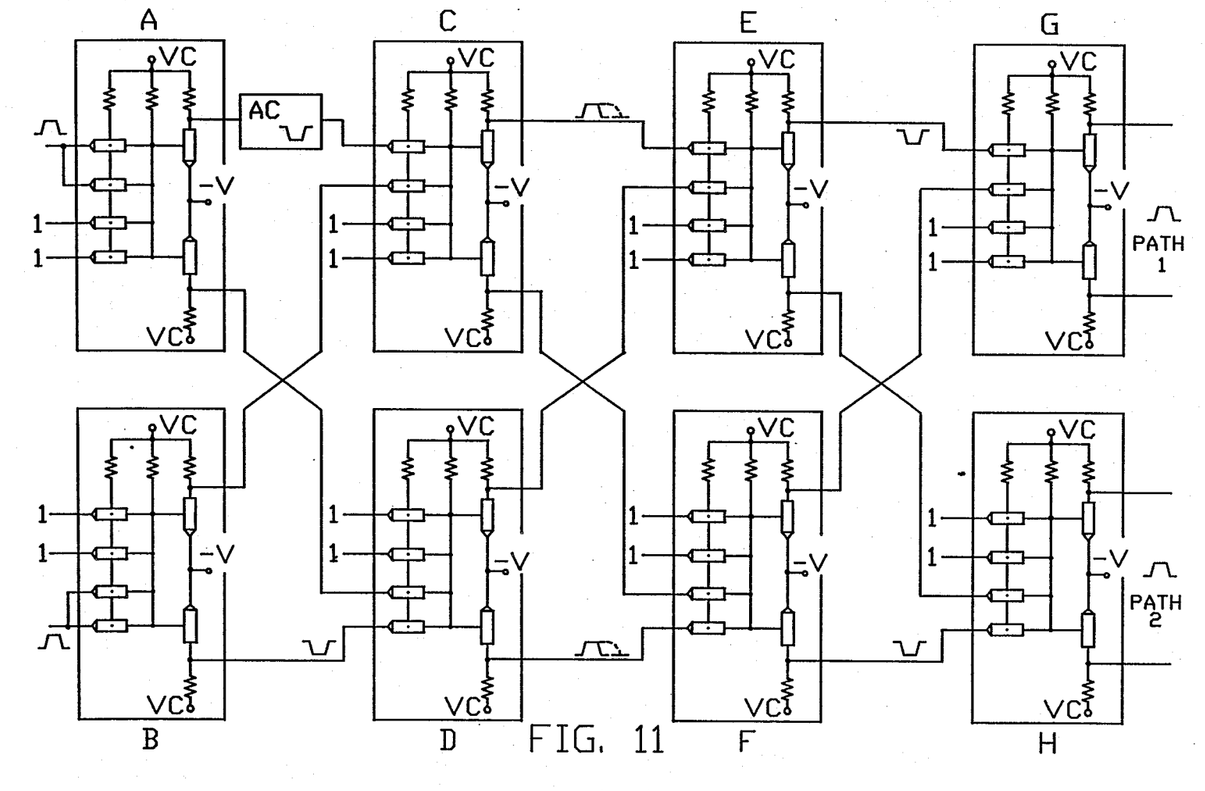
FIG. 11 discloses an (TTL) fault-tolerant logic circuit in accordance with the invention.

The TTL logic gate implementation for rejecting AC defects is shown in FIG. 11. The logic signal path includes PATH 1 and PATH 2. Each path includes the double output TTL logic gates with multiple inputs. For clarity of the diagram, the logic gates creating logic 1 levels are not shown, but are of the same type as shown in the diagram. PATH 1 consists of logic gates A, C, E, and G. PATH 2 consists of logic gates B, D, F, and H. Each of the logic gates A, B, C, D, E, F, G, and H are composed of double output TTL logic gates with four input lines. Operation of these logic gates was described above. Logic gate A output 1 is connected to logic gate C input and logic gate A output 2 is connected to logic gate D input. However, in this example logic gate A output 1 has two AC defects which cause the logic 1 level to logic 0 level to be delayed and logic 0 level to logic 1 level to be delayed compared to logic gate A output 2 delay. Logic gate B output 1 is connected to logic gate C input and logic gate B output 2 is connected to logic gate D input. This pattern of logic gate output signals going to two different logic gates is repeated through the remainder of PATH 1 and PATH 2. The outputs of logic gates C and D go to logic gates E and F. The outputs of logic gates E and F go to logic gates G and H.

In FIG. 11, the circuit operates as follows. A logic 0 level to logic 1 level transition at the inputs of logic gate A produces a logic 1 level to logic 0 level transition at both outputs. One of the logic 1 level to logic 0 level transitions intended for logic gate C has an AC defect which causes it to arrive much later at logic gate C than the other signals. The second logic 1 level to logic 0 level transition goes to logic gate D. Since both PATH 1 and PATH 2 are propagating the same signal, the inputs to logic gate B are also logic 0 level to logic 1 level transitions. The outputs of logic gate B are also at a logic 1 level to logic 0 level transitions. One of the logic 1 to 0 transitions goes to logic gate C, while the second logic 1 to 0 level transitions goes to logic gate D. Logic gate C now has one logic 1 to 0 level transition and two logic 1 levels and one delayed logic 1 to 0 transition. The first logic 0 to logic gate C will cause logic gate C output to change from a logic 0 level to a logic 1 level. A second logic 0 level will not change the logic gate C output levels. When the delayed logic 1 level to logic 0 level arrives at logic gate C, the output of logic gate C will already be changing due to the first logic 1 to 0 level transition from gate B. The delayed signal has no effect on the propagation of the signal in the logic path and therefore it is rejected. The logic signal will continue to propagate in the logic path as if the delayed signal never occurred. It is apparent in this example the delayed logic signal was absorbed at logic gate C and will not continue the remainder of the logic gate path. Logic signal transitions will continue in both PATH 1 and PATH 2, alternating between logic level 1 to 0 transitions and logic level 0 to 1 transitions at the outputs of the logic gates as if no defect ever occurred in the logic path.

Not only can a delayed logic level 1 to 0 transition exist, but a delayed logic level 0 to 1 transition can also exist. Referring to FIG. 11, a logic level 1 to 0 transition at two inputs and a logic 1 level at two inputs of logic gate A produces a logic level 0 to 1 transition at both outputs. One of the logic level 0 to 1 transitions intended for logic gate C is delayed, compared to the second signal going to logic gate D, due to an AC defect. Since both PATH 1 and PATH 2 are propagating the same signal, the inputs to logic gate B are also two logic level 1 to 0 transitions and two logic 1 levels. The outputs of logic gate B are also logic level 0 to 1 transitions. One of the logic 0 to 1 transitions goes to logic gate C, while the second logic level 0 to 1 transitions goes to logic gate D. Logic gate C inputs now have a logic level 0 to 1 transition, two logic 1 levels and a delayed logic level 0 to 1 transition. The delayed logic level 0 to 1 transition causes both outputs of logic gate C to be a delayed logic level 1 to 0 transition since all the inputs of NAND circuit must at a logic level 1 before the output can be a logic 0 level. The delayed logic level 0 to 1 transition will provide the last logic level 1 for logic gate C to go to a logic level 0. One of the delayed transitions goes to logic gate E and the other delayed transition goes to logic gate F. On the other hand, logic gate D receives both logic level 0 to 1 transitions undelayed. The inputs to logic gate D are two logic level 0 to 1 transitions and two logic 1 levels. The two outputs of logic gate D are logic level 1 to 0 transitions. One of the logic level 1 to 0 transitions goes to logic gate E. Logic gate E inputs have a delayed logic level 1 to 0 transition from gate C, an undelayed logic level 1 to 0 transition from gate D, and two other logic 1 levels. Since the undelayed logic level 1 to 0 transition is first, it will cause the two logic gate E outputs to have a logic level 0 to 1 transition. The delayed signal from logic gate C is rejected since both logic gate E outputs have already changed logic states. Logic gate E outputs, logic level 0 to 1 transitions, continue to logic gates G and H undelayed. Logic gate F inputs have a delayed logic level 1 to 0 transition from gate C, an undelayed logic level 1 to 0 transition from gate D, and two other logic 1 levels. As with logic gate E, the undelayed logic level 1 to 0 transition arrives first, compared to the delayed signal, causing the two logic gate outputs to go from a logic 0 level to a logic 1 level. The delayed signal from logic gate C is received at logic gate F after the outputs have changed logic states. Therefore, the delayed signal is also rejected at logic gate F as it was at logic gate E. Since the outputs of both logic gates E and F are undelayed, the logic signal will continue to propagate through the remainder of the logic path undelayed.

As shown above, both logic level 1 to 0 and 0 to 1 transitions are rejected by the circuit. This permits minor AC defects to occur in the logic path without changing the logic path signal propagation time.

While the invention has been particularly described with reference to the preferred embodiments thereof, it will be understood by those skilled in the art that the foregoing and other changes in form and detail may be made therein without departing from the spirit and scope of the invention:

What is claimed is:

1. A fault tolerant logic circuit, said fault tolerant circuit including:

first, second/third, fourth, fifth, sixth, seventh and eighth logic gate circuits, each of said first through eighth logic gate circuits having at least first, second and third inputs and first and second independent outputs;

a first direct connection between said first output of said first logic gate circuit and said first input of said third logic gate circuit;

a second direct connection between said second output of said first logic gate circuit and said first input of said fourth logic gate circuit;

a third direct connection between said first output of said second logic gate circuit and said second input of said third logic gate circuit;

a fourth direct connection between said second output of said second logic gate circuit and said second input of said fourth logic gate;

a fifth direct connection between said first output of said third logic gate circuit and said first input of said fifth logic gate circuit;

a sixth direct connection between said second output of said third logic gate circuit and said first input of said sixth logic gate circuit;

a seventh direct connection between said first output of said fourth logic gate circuit and said second input of said fifth logic gate circuit;

an eighth direct connection between said second output of said fourth logic gate circuit and said second input of said sixth logic gate circuit;

a ninth direct connection between said first output of said fifth logic gate circuit and said first input of said seventh logic gate circuit;

a tenth direct connection between said second output of said fifth logic gate circuit and said first input of said eighth logic gate circuit;

an eleventh direct connection between said first output of said sixth logic gate circuit and said second input of said seventh logic gate circuit; and a twelfth direct connection between said second output of said sixth logic gate circuit and said second input of said eighth logic gate circuit, whereby said fault tolerant circuit will function properly in the presence of at least certain open connections, shorted connections and grounded connections.

2. A fault tolerant logic circuit as recited in claim 1 wherein each of said first through eighth logic gate circuits comprise:

first, second and third transistors, said first transistor having first, second and third emitters, a base, and a collector, said second transistor having an emitter, base and collector, said third transistor having an emitter, base and collector, said first, second and third emitters of said first transistor respectively connected to receive first, second and third inputs, said collector of said first transistor, said base of said second transistor and said base of said third transistor connected in common, said emitters of said second and third transistors connected in common to a first source of potential, said collector of said second transistor connected to provide a first output and said collector of said third transistor connected to provide a second output;

a first resistor connected between said base of said first transistor and a second source of potential;

a second resistor connected between said collector of said first transistor and said second source of potential;

a third resistor connected between said collector of said second transistor and said second source of potential; and a fourth resistor connected between said collector of said third transistor and said second source of potential.

3. A fault tolerant logic circuit as recited in claim 1, wherein each of said first through eighth logic gate circuits, comprise:

first, second, third, fourth, fifth, sixth and seventh transistor, each of said first through seventh transistors having an emitter, base and collector, said collector of said fourth transistor connected to a first source of potential, said collector of said fifth transistor connected to said first source of potential, said collector of said sixth transistor connected to said first source of potential, said base of said fourth transistor connected to a first source of reference potential, said bases of said first, second and third transistors respectively connected to receive first, second and third inputs, said emitter of said fifth transistor connected to provide a first output, said emitter of said sixth transistor connected to provide a second output, and said base of said seventh transistor connected to a second source of reference potential;

first connection means, said first connection means connecting in common said collector of said first transistor, said collector of said second transistor, said collector of said third transistor, said base of said fifth transistor and said base of said sixth transistor;

second connection means, said second connection means connecting in common said emitter of said first transistor, said emitter of said second transistor, said emitter of said third transistor, said emitter of said fourth transistor and said collector of said seventh transistor;

a first resistor connected between said first connection means and said first source of potential;

a second resistor connected between said emitter of said fifth transistor and a second source of potential;

a third resistor connected between said emitter of said sixth transistor and said second source of potential; and a fourth resistor connected between said emitter of said seventh transistor and a third source of potential.

4. A fault tolerant logic circuit, said fault tolerant logic circuit comprising:

a first signal path having n logic gates, where n is a positive integer equal to three or more, each of said n logic gates of said first signal path having at least first and second inputs and first and second independent outputs;

a second signal path having n logic gates, where n is a positive integer equal to three or more, each of said logic gates of said second signal path having at least first and second inputs and first and second independent outputs; and said fault tolerant logic circuit being characterized in that, said first independent output of the first logic gate of said first signal path is connected to a predetermined input of of said n logic gates of said first signal path, and said second independent output of the first logic gate in said first signal path is connected to a predetermined input of a second or higher order of said n logic gates of said second signal path, with the connection of the first and second independent outputs for the second thru n logic gates of said first signal path being made to a predetermined higher order gate in the first and second signal path;

said first independent output of the first logic gate of said second signal path is connected to a predetermined input of a second or higher order of said n logic gates of said second signal path, and said second independent output of the first logic gate of said second signal path is connected to a predetermined input of a second or higher order of said n logic gates of said first signal path, with the connection of the first and second independent output for the second thru n logic gate of said second signal path being made to a predetermined higher order gate in the first and second signal path.

5. A fault tolerant logic circuit, as recited in claim 4, wherein each of said n logic gates of said first and second signal paths is a TTL gate.

6. A fault tolerant logic circuit as recited in claim 5 wherein each of said first through eighth logic gate circuits comprise:

first, second and third transistors, said first transistor having first, second and third emitters, a base, and a collector, said second transistor having an emitter, base and collector, said third transistor having an emitter, base and collector, said first, second and third emitters of said first transistor respectively connected to receive first, second and third inputs, said collector of said first transistor, said base of said second transistor and said base of said third transistor connected in common, said emitters of said second and third transistors connected in common to a first source of potential, said collector of said second transistor connected to provide a first output and said collector of said third transistor connected to provide second output;
a first resistor connected between said base of said first transistor and a second source of potential;
a second resistor connected between said collector of said first transistor and said second source of potential;
a third resistor connected between said collector of said second transistor and said second source of potential; and
a fourth resistor connected between said collector of said third transistor and said second source of potential.

7. A fault tolerant logic circuit, as recited in claim 4, wherein each of said logic gates of said first and second signal paths is an ECL gate.

8. A fault tolerant logic circuit as recited in claim 7, wherein each of said first through eighth logic gate circuits comprise:
first, second, third fourth, fifth, sixth, and seventh transistors, each of said first through seventh transistors having an emitter, base and collector, said collector of said fourth transistor connected to a first source of potential, said collector of said fifth transistor connected to said first source of potential, said collector of said sixth transistor connected to said first source of potential, said base of said fourth transistor connected to a source of reference potential, said bases of said first, second and third transistor respectively connected to receive first, second and third inputs, said emitter of said fifth transistor connected to provide a first output and said emitter of said sixth transistor connected to provide a second output, said base of said seventh transistor connected to a second source of reference potential;
first connection means, said first connection means connecting in common said collector of said first transistor, said collector of said second transistor, said collector of said third transistor, said base of said fifth transistor and said base of said sixth transistor;
second connection means, said second connection means connecting in common said emitter of said first transmitter, said emitter of said second transistor, said emitter of said third transistor, said emitter of said fourth transistor and said collector of said seventh transistor;
a first resistor connected between said first connection means and said first source of potential;
a second resistor connected between said emitter of said fifth transistor and a second source of potential;
a third resistor connected between said emitter of said sixth transistor and said second source of potential; and
a fourth resistor connected between said emitter of said seventh transistor and a third source of potential.

9. A fault tolerant logic circuit capable of absorbing DC and AC faults comprising:
a first signal path having an input, an output and a plurality of logic gate circuits interconnected between said input and output of said first signal path;
a second signal path having an input, and output and a plurality of logic path circuits interconnected between said input and output of said second signal path;
said fault tolerant logic circuit being characterized in that each of said logic gate circuits of said first and second signal paths have first and second independent outputs and the first and second independent outputs of each of said logic gate circuits are connected to the inputs of a predetermined higher order logic gate circuit in each of said first and second interconnected signal paths with the connection of said independent outputs being repeated to predetermined inputs of higher order logic gate circuits for the remaining logic gate circuits until a signal path output is derived for the first and second signal path.

10. A fault tolerant logic circuit, as recited in claim 9, wherein said logic gate circuits of said first and second signal paths are either TTL or ECL circuits.

* * * * *

UNITED STATES PATENT AND TRADEMARK OFFICE
CERTIFICATE OF CORRECTION

PATENT NO. : 4,829,198

DATED : May 9, 1989

INVENTOR(S) : Gerald A. Maley, Joseph M. Mosley, and Stephen D. Weitzel

It is certified that error appears in the above-identified patent and that said Letters Patent is hereby corrected as shown below:

Column 14, line 34, change "second/third," to read --second, third,--.

Column 16, line 23, change "said logic gates" to read --said n logic gates--.

Signed and Sealed this

Tenth Day of October, 1989

Attest:

DONALD J. QUIGG

*Attesting Officer*  *Commissioner of Patents and Trademarks*